(12) United States Patent
Okandan et al.

(10) Patent No.: US 10,483,316 B2
(45) Date of Patent: Nov. 19, 2019

(54) FABRICATION AND OPERATION OF MULTI-FUNCTION FLEXIBLE RADIATION DETECTION SYSTEMS

(71) Applicant: mPower Technology, Inc., Albuquerque, NM (US)

(72) Inventors: Murat Okandan, Edgewood, NM (US); Markku Juhani Koskelo, Albuquerque, NM (US)

(73) Assignee: mPower Technology, Inc., Albuquerque, NM (US)

( * ) Notice: Subject to any disclaimer, the term of this patent is extended or adjusted under 35 U.S.C. 154(b) by 0 days.

(21) Appl. No.: 15/404,978

(22) Filed: Jan. 12, 2017

(65) Prior Publication Data

US 2017/0200762 A1 Jul. 13, 2017

Related U.S. Application Data

(60) Provisional application No. 62/278,103, filed on Jan. 13, 2016.

(51) Int. Cl.
| | | |
|---|---|---|
| G01T 1/24 | (2006.01) | |
| H01L 27/146 | (2006.01) | |
| G01T 3/08 | (2006.01) | |

(52) U.S. Cl.
CPC ........ H01L 27/14659 (2013.01); G01T 1/241 (2013.01); G01T 3/08 (2013.01)

(58) Field of Classification Search
CPC ...... G01T 1/241; G01T 3/08; H01L 27/14659
See application file for complete search history.

(56) References Cited

U.S. PATENT DOCUMENTS

| 4,089,705 A | 5/1978 | Rubin |
|---|---|---|
| 4,633,031 A | 12/1986 | Todorof |
| (Continued) | | |

FOREIGN PATENT DOCUMENTS

| CN | 102097541 | 6/2011 |
|---|---|---|
| CN | 102157622 | 8/2011 |
| (Continued) | | |

OTHER PUBLICATIONS

Bollier, "The Blockchain: a Promising New Infrastructure for Online Commons", http://bollier.org/blog/blockchain-promising-new-infrastructure-online-commons, Mar. 4, 2015, 1-2.

(Continued)

*Primary Examiner* — Marcus H Taningco
(74) *Attorney, Agent, or Firm* — Peacock Law P.C.; Philip D. Askenazy

(57) ABSTRACT

Curved, flexible arrays of radiation detectors are formed by using standard silicon semiconductor processing materials and techniques and additional functionalization through integration of conversion and shielding materials. The resulting flexible arrays can be handled, integrated, further functionalized and deployed for a wide variety of applications where conventional sensors do not provide the desired functionality, form factors and/or reliability. The arrays can be stacked and include multiple types and thicknesses of conversion layers, enabling the detector to simultaneously detect multiple radiation types, and perform complex, simultaneous functions such as energy discrimination, spectroscopy, directionality detection, and particle trajectory tracking of incident radiation.

17 Claims, 3 Drawing Sheets

(56) References Cited

U.S. PATENT DOCUMENTS

| | | | |
|---|---|---|---|
| 4,805,006 A | | 2/1989 | Yamaguchi et al. |
| 5,374,935 A | | 12/1994 | Forrest |
| 5,407,491 A | | 4/1995 | Freundlich et al. |
| 5,444,249 A | | 8/1995 | Wong |
| 5,457,322 A | * | 10/1995 | Kitaguchi ............. H01L 31/115 250/370.02 |
| 5,730,808 A | | 3/1998 | Yang et al. |
| 5,733,382 A | | 3/1998 | Hanoka |
| 6,490,477 B1 | * | 12/2002 | Zylka ...................... A61B 6/04 600/414 |
| 6,909,098 B2 | | 6/2005 | Bross et al. |
| 7,567,649 B1 | * | 7/2009 | Safai ......................... G01T 1/24 250/370.09 |
| 8,879,688 B2 | * | 11/2014 | Safai ..................... G01N 23/203 378/86 |
| 8,994,137 B2 | * | 3/2015 | Padinger ............... H01L 27/307 257/40 |
| 9,116,249 B1 | | 8/2015 | Claus et al. |
| 9,141,413 B1 | | 9/2015 | Cruz-Campa et al. |
| 9,511,393 B2 | * | 12/2016 | Safai ..................... B06B 1/0622 |
| 9,559,229 B2 | | 1/2017 | Chen |
| 2003/0155516 A1 | * | 8/2003 | Spartiotis ............. G01T 1/2928 250/370.09 |
| 2003/0173523 A1 | * | 9/2003 | Vuorela ............ H01L 27/14634 250/370.13 |
| 2009/0071528 A1 | * | 3/2009 | Chen ........................ H02S 30/20 136/246 |
| 2010/0282293 A1 | | 11/2010 | Meyer et al. |
| 2010/0283612 A1 | | 11/2010 | Wong et al. |
| 2010/0327171 A1 | * | 12/2010 | Robinson .................. G01T 3/08 250/370.05 |
| 2011/0005570 A1 | | 1/2011 | Jain |
| 2011/0277835 A1 | | 11/2011 | Masson et al. |
| 2012/0000502 A1 | | 1/2012 | Wiedeman et al. |
| 2012/0145231 A1 | | 6/2012 | Woods et al. |
| 2012/0265975 A1 | | 10/2012 | Kimelman |
| 2013/0048861 A1 | * | 2/2013 | Ohta ................. H01L 27/14663 250/366 |
| 2013/0161772 A1 | * | 6/2013 | Chan ................. H01L 31/02322 257/428 |
| 2013/0206219 A1 | | 8/2013 | Kurtin et al. |
| 2013/0213462 A1 | | 8/2013 | Lewis et al. |
| 2013/0264669 A1 | * | 10/2013 | Li ................... H01L 31/022408 257/431 |
| 2013/0269747 A1 | | 10/2013 | Lentine et al. |
| 2013/0314236 A1 | | 11/2013 | Warren |
| 2013/0344645 A1 | | 12/2013 | Ahmari et al. |
| 2014/0060616 A1 | | 3/2014 | Okandan et al. |
| 2014/0102531 A1 | | 4/2014 | Moslehi |
| 2014/0203392 A1 | * | 7/2014 | Li .................. H01L 31/022408 257/459 |
| 2014/0266289 A1 | | 9/2014 | Della Sera et al. |
| 2014/0334601 A1 | * | 11/2014 | Shizukuishi ...... H01L 27/14661 378/62 |
| 2015/0114444 A1 | | 4/2015 | Lentine et al. |
| 2015/0114451 A1 | | 4/2015 | Anderson et al. |
| 2015/0280025 A1 | | 10/2015 | Bellanger et al. |
| 2015/0311371 A1 | | 10/2015 | Krishnamoorthy |
| 2015/0349176 A1 | | 12/2015 | Morad et al. |
| 2015/0349703 A1 | | 12/2015 | Morad et al. |
| 2016/0015350 A1 | * | 1/2016 | Chang ................. A61B 6/5258 250/362 |
| 2016/0268455 A1 | | 9/2016 | Levy et al. |
| 2016/0359637 A1 | | 12/2016 | Okandan |
| 2016/0380143 A1 | | 12/2016 | Hekmatshoartabari et al. |
| 2017/0358041 A1 | | 12/2017 | Forbes, Jr. et al. |

FOREIGN PATENT DOCUMENTS

| | | |
|---|---|---|
| CN | 105023921 | 11/2015 |
| EP | 0109179 | 5/1984 |
| KR | 2010043654 | 4/2010 |

OTHER PUBLICATIONS

Kerr, et al., "Surface recombination velocity of phosphorus-diffused silicon solar cell emitters passivated with plasma enchanced chemical vapor deposited silicon nitride and thermal silicon oxide", Journal of Applied Physics, vol. 89, No. 7, American Institute of Physics, Apr. 1, 2001, 3820-3826.

Kim, et al., "Cascade Modeling of Pixelated Scintillator Detectors for X-Ray Imaging", IEEE Transactions on Nuclear Science, vol. 55, No. 3, Jun. 2008, 1367-1366.

Lentine, et al., "Optimal Cell Connections for Improved Shading, Reliability, and Spectral Performance of Microsystem Enabled Photovolutaic (MEPV) Modules", Presented at 35th IEEE PVSC Conference, Jun. 20-25, 2010.

Nikolic, et al., "Fabrication of Pillar-Structured Thermal Neutron Detectors", 2007 IEEE Nuclear Science Symposium Conference Record, 2007, 1577-1580.

Shen, et al., "Two-terminal Monolithic InP/InGaAsP Tandem Solar Cells with Tunneling Intercell Ohmic Connections", Conference Record of the Twenty Second IEEE Photovoltaic Specialists Conference, Oct. 7, 1991, 381-387.

\* cited by examiner

FABRICATION AND OPERATION OF MULTI-FUNCTION FLEXIBLE RADIATION DETECTION SYSTEMS

CROSS-REFERENCE TO RELATED APPLICATIONS

This application claims priority to and the benefit of filing of U.S. Provisional Patent Application Ser. No. 62/278,103, entitled "FABRICATION AND OPERATION OF MULTI-FUNCTION FLEXIBLE RADIATION DETECTION SYSTEMS", filed on Jan. 13, 2016, the specifications and claims of which are incorporated herein by reference.

BACKGROUND OF THE INVENTION

Field of the Invention (Technical Field)

The present invention is related to fabrication, assembly, feature integration and operation of low cost, flexible, high performance radiation detectors based on thin, singulated, flexible semiconductor devices and necessary functionalization materials.

Background Art

Note that the following discussion may refer to a number of publications and references. Discussion of such publications herein is given for more complete background of the scientific principles and is not to be construed as an admission that such publications are prior art for patentability determination purposes.

Radiation detection is a critical function for a very large variety of applications, ranging from biomedical, to homeland defense, military, environmental monitoring, disaster response and natural resource mapping and many others. Legacy radiation detectors have relied on very well established methods and instruments for detection of high energy photons (gamma, x-ray), alpha, beta or neutron particles, as well as protons, and heavy and light nuclei. Such legacy detectors include gas detectors that rely on the ionization of the detector gas to detect the incident alpha, beta or gamma or neutron radiation, including Geiger-Mueller detectors, proportional counters, He-3 tubes for neutron detection, cloud chambers for heavy nuclei detection, and many other configurations. Another class of radiation detectors consists of scintillation detectors where the incoming radiation interacts with detector material that produces light (in some cases electrons) as a result of the interaction. The light produced in this interaction may or may not be proportional to the energy of the incident radiation, but is typically at least proportional to the intensity of the incident radiation. The light produced from this interaction in a scintillation detector is captured by a light capture detector, such as a photomultiplier tube, or a photodiode, for example. In other instances, the radiation is detected with a solid state material where the interaction of the radiation with the detector produces electron-hole pairs that are swept into the electrodes connected to the detector material to produce an electronic pulse of different magnitude depending on the number of electron-hole pairs that the interaction has produced.

The gas detectors can be made specifically to detect different types of radiation by selection of the fill gas, thickness of the detector "window" through which the radiation reaches the detector volume, and the operating voltage. Typically, gas detectors cannot differentiate between the energies of the incident radiation. They can be used to detect the presence or absence of the type of radiation they are designed to measure and/or to measure the intensity of such radiation present. Gas detectors are typically operated at ambient temperature. Scintillation detectors typically provide a light signal that is proportional to the energy of the incoming radiation, as well as being proportional to the intensity of the incident radiation. For some scintillation materials, e.g., plastic scintillators, the energy resolution is minimal. For others, such as NaI or CsI, the detectors are classified as medium resolution detectors. Scintillation detectors are also typically operated at ambient temperature. Solid state detectors provide a direct electronic signal that is proportional to both the energy of the incident radiation and the intensity of the incident radiation. Solid state detectors are generally classified to be high energy resolution detectors. They range from silicon detectors for alpha and beta measurements to CdTe detectors (neither of which requires cooling) to Ge detectors that are cooled to liquid nitrogen temperature for proper operation.

Each of these detector types have weaknesses and limitations. Gas detectors have little stopping power to see higher energy gammas, and saturate easily without special electronic circuitry and tricks. It is difficult to automate the manufacturing of gas detectors, which keeps the detector prices high. Scintillation detectors have good stopping power, but are very heavy being large detectors, difficult to handle, cannot take rough handling, and are expensive. CdTe detectors simply cannot be made in large size; if a large detector active size is required, one must use arrays of the detectors which is both expensive and requires duplication of the electronics adding to the complications and expense. HPGe detectors have the ultimate energy resolution but require cooling mechanisms (liquid nitrogen dewars or mechanical cooling systems), which makes them both expensive and bulky. They also cannot be made arbitrarily large. Furthermore, many of these systems are bulky, require integration and careful handling of fragile and/or hazardous materials and some systems also require cryogenic cooling to achieve the desired functionality.

SUMMARY OF THE INVENTION

The present invention is a radiation detector comprising an array of microscale semiconductor sensors disposed on a flexible substrate and at least one type of conversion layer, wherein the conversion layer is sufficiently thin to enable the detector to flex in accordance with the substrate. The conversion layer is preferably disposed on top of each sensor, on one or more sides of each sensor, or both on top and on one or more sides of each sensor. The sensors preferably comprise solar cells, photodiodes, or one or more p-n junctions. The sensors preferably detect photons or electrons produced by the conversion layer when the conversion layer is illuminated by incident radiation. The radiation detector is preferably formable into an arbitrary three dimensional shape, and optionally comprises a rigid backer to maintain that shape. The radiation detector preferably comprises different types and/or thicknesses of conversion layers, which allows it to simultaneously detect two or more types of radiation. The types of radiation are preferably selected from the group consisting of x-rays, gamma rays, microwaves, neutrons, alpha particles, beta particles, and cosmic radiation. The radiation detector preferably can perform energy discrimination and/or spectroscopy of incident radiation.

The radiation detector optionally comprises multiple stacked substrates and sensor arrays, which enables it to detect directionality and/or track particle trajectories of incident radiation. A stacked detector also generates multiple signals for each incident radiation particle or photon as it passes through the detector layers, generating a higher signal. The radiation detector preferably comprises integrated circuitry for performing one or more functions on signals produced by the detectors, the functions selected from the group consisting of pre-conditioning, amplification, filtering, and processing. The integrated circuitry is preferably embedded with each sensor, which preferably enables the one or more functions to be performed without the signals having to first be transmitted to an edge circuit. The integrated circuitry is preferably manufactured in the same process as a process used to manufacture the sensors or optionally is added to the detector after the sensors are manufactured. Flexing of the conversion layer in accordance with flexing of the substrate preferably does not result in substantial loss of functionality.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the figures.

DETAILED DESCRIPTION OF EMBODIMENTS OF THE INVENTION

Figure 1A:
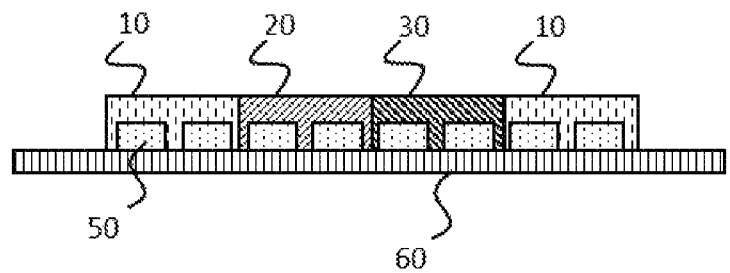
FIG. 1A shows an embodiment of detector elements of the present invention.

Embodiments of the present invention provide significant improvements in radiation detection through the use of micro-scale, individually mechanically separated semiconductor detector elements and electronic circuitry that are preferably interconnected on an integrated mechanically flexible substrate, which are preferably further functionalized with the necessary conversion and shielding materials. In previous attempts at integration of conversion materials with semiconductor detectors, the fragile nature of the semiconductor layers and the challenges in integration of the desired conversion materials have limited the functionality and utility of such detectors.

The individual detector elements (e.g. p-n junctions) and electronic circuitry to pre-condition and process the generated signals are preferably manufactured using standard silicon semiconductor processing tools and materials. Desired conversion materials are then preferably spun-on in liquid or gel form, evaporated, ink-jet dispensed or applied by other methods onto sensor arrays in wafer form (or in individual segments after the sensor arrays have been cut into segments). The conversion materials interact with the incoming radiation and produce energetic particles and/or photons which are then detected by the micro-scale, singulated detectors and processed by the integrated electronics and/or by electronics that are external to the array. For example, incoming neutrons can be captured by Gadolinium or Boron-10 (applied on the arrays as Gadolinium oxide or Boron-10 nanoparticle/particle suspension and dried or cured in place) which produces energetic particles that are then implanted into the silicon p-n junction. During the implantation of these particles into the silicon, a large number of electron-hole pairs are produced that are then collected by the p-n junction which produces the electrical signal. In the Boron-10 neutron capture reaction, there is an accompanying 2.3 MeV gamma photon that is emitted which does not interact significantly with the silicon in the detectors or the conversion material. In another example for x-ray detection, a suitable conversion/scintillation material (for example, cesium iodide—CsI) is coated around and/or on the detectors. When x-rays are incident on the material, photons are produced which are then captured by the silicon p-n junctions and turned into electron-hole pairs, which produces the desired electrical signal. Other conversion materials are tungsten and copper: when x-ray or gamma photons are incident on tungsten and/or copper, energetic electrons are emitted, which then interact with the silicon p-n junctions. During the interaction of these energetic electrons and silicon, a large number of secondary electrons (electron-hole pairs) are produced, which are then collected by the p-n junctions as the signal.

Integrated circuitry for signal pre-conditioning and processing is preferably manufactured in the same process as the detectors (p-n junctions), or alternatively are assembled onto the array after the detectors are formed. The circuitry could be produced by bulk-CMOS or SOI-CMOS processes, depending on the application environment and processing circuitry needs (speed, density, device types, etc.). SOI CMOS has the benefit of being more radiation resistant than bulk-CMOS devices and circuits. The output from arrays of the detector elements can be detected individually, summed across a sub-array, or subtracted from each other for background reduction, by the interconnection (wiring) or by the functions provided by the integrated circuitry. Similar arrangements are found on CCD and CMOS detector arrays for optical and other radiation detectors, but those exist in rigid, non-flexible formats. In other embodiments, small CMOS and/or CCD detector arrays can be integrated and assembled as described above using SOI CMOS or bulk CMOS manufacturing processes.

Embodiments of the present invention provide the ability to manufacture, handle and integrate arbitrarily thin, arbitrary size and shape semiconductor devices (both detector elements and circuitry elements) and the other necessary materials. While it is possible to just thin semiconductor wafers to several microns (2-10 um), the resulting material is very fragile and is not conducive to further handling and integration without significant process complexity. The approach and methodology presented here preferably uses the same semiconductor processes, materials and tools, and with the addition of the flexible interconnection layer and singulation, it enables the devices and assemblies to be handled, further processed, integrated and deployed for applications where other detector assemblies are not able to meet the necessary reliability and functionality requirements. For example, this approach preferably enables the selection of the silicon p-n junction layer and conversion/shielding layer thicknesses independently in order to optimize for the desired sensor characteristics such as conversion efficiency, speed, spatial resolution, mechanical features, etc. For example, the silicon detector layer could be in the range of 1-100 µm, conversion/shielding layer could be 0.5 µm-1 mm, and alternating shielding/conversion layers could be deposited on top of each other (on top of the detector array) to achieve the desired energy range selectivity and specific radiation rejection properties. As used throughout the specification and claims, the term "microscale" means having all dimensions from approximately 0.1 µm to approximately 5 mm.

Embodiments of the present invention provide the ability to mix and match different detector types (neutron, gamma, x-ray, etc.) in a hybrid 'solid-state bubble chamber', formed by selective deposition of different conversion materials in a planar format (for example by ink-jetting of different conversion and/or filtering material suspensions on detector arrays), and subsequent 3D Cartesian stacked or curved stacked assembly of these thin detector layers. The interconnections between the stacked layers is preferably provided by embedded wiring in the flexible substrate as an initial planar structure is folded and/or bent to create the desired structure, and/or by forming connections among assembled layers through solder, conductive epoxy or other attachment techniques at specific bond pad locations in the flexible substrate and/or IC chips. With the utilization of integrated electronics, it is then possible to track particle trajectories, do energy selective detection (spectroscopy), determine source localization/directionality, or simply perform total dose measurements for multiple radiation types simultaneously with the same detector assembly.

Embodiments of the present invention comprise very-large aperture sensors. With the tiling of sensor elements and arrays, it becomes possible to cover very large areas (many square meters) with a single, fold-out sensor array—which can then be further arrayed to cover even larger areas. Integration of such sensor arrays on UAV wings or other aircraft/spacecraft enables surveying and high resolution imaging of radiation sources. This large area deployment option, along with the potential for low cost per sensor, enables wide-area surveillance of radiation by fixed and/or mobile sensor arrays, which is not feasible with current sensors.

The present invention also has biomedical applications. For example, intra-oral x-ray detectors are rapidly expanding and providing great results with improved care and reduced costs, and reduced materials/chemical use compared to film based techniques. However, intra-oral sensors are uncomfortable for many patients due to their large, rigid format, and smaller size detectors suffer from reduced imaging area and loss of resolution at their edges. A curved detector produced by the techniques described here solves both problems, by allowing a curved detector to fit into the oral cavity more comfortably and providing better resolution owing to the curved nature of the imaging plane. Similar benefits are also provided by these sensors in digital mammography, panoramic x-ray (dental) radiography, CT scanning and other radiation detection based techniques. With the ability to achieve higher resolution images with lower radiation levels, it is possible to reduce patient radiation exposure levels significantly with the use of detectors of the present invention.

Figure 1B:
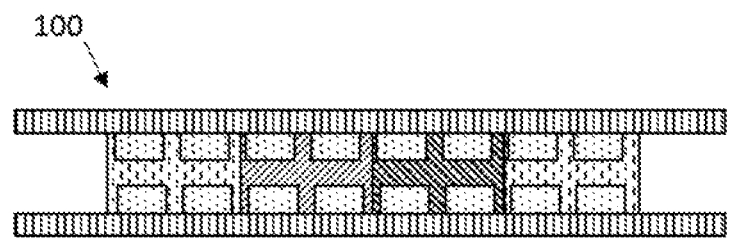
FIG. 1B shows the detector elements of FIG. 1A in a stacked configuration.
Figure 1C:
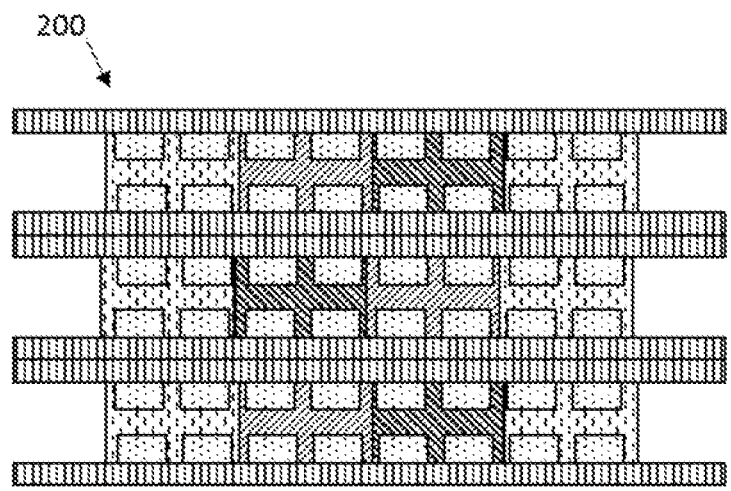
FIG. 1C shows further stacking of the configuration of FIG. 1B

FIG. 1A is a schematic representation of detector elements 50 that have been formed using semiconductor processing techniques from microelectronics and solar industries. The sensors are singulated and interconnected using polymeric or other insulating layers and metallic lines. These features can be formed by standard deposition, patterning, etching techniques and/or by printing techniques such as inkjet printing, screen-printing, etc. Each detector element may comprise a single p-n junction or alternatively a p-n junction array with optional embedded electronics for signal detection and processing and communications. Conversion layers 10, 20, 30, which respond to the incoming radiation and produce output that is then detected by the sensors, are also added using printing, attachment or other deposition techniques. These layers may comprise single type over the whole array or could be a mixture of several different types over different regions of the sensor array, as indicated. The individual sensors are assembled on a rigid or flexible interconnect layer 60. As shown in FIGS. 1B and 1C, the layers may then be further incorporated into stacks 100, 200, comprising multiple layers assembled onto each other, either with conversion layers facing each other as shown, or alternatively with conversion layers in contact with interconnect layer 60. FIG. 1C shows the next stage of integration, where different sensor types (gamma, neutron, x-ray, etc.) are uniformly arranged, or alternatively arbitrarily distributed, throughout the assembly to allow coincidence detection, spectroscopy, directionality, particle tracking, energy resolution, or other functionality. The flexible interconnect structure provides the electrical connectivity throughout the arrays and stacks, where the layer to layer connections are accomplished by connecting sensors, electronics and traces at the edges or throughout the array by vias formed in the sensors and/or electronic components, such as through-silicon vias (TSVs).

Figure 2A:
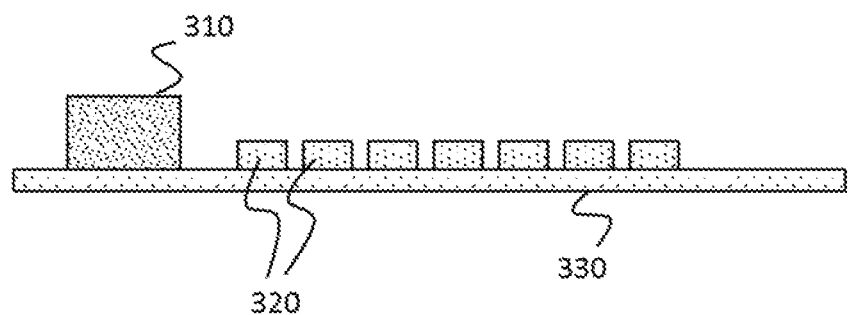
FIG. 2A shows an embodiment in which the active electronic elements are embedded by pick-and-place assembly or formed during the processing of the detectors and circuits.
Figure 2B:
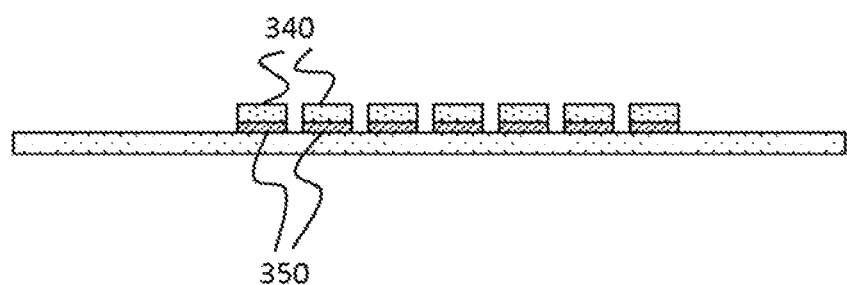
FIG. 2B shows the combination of embedded circuitry and sensors.

FIGS. 2A and 2B are schematic representations of integration of electronic functionality in the arrays and individual sensors. Integrated circuits (ICs) 310 can be assembled onto the arrays as pick-and-place components; alternatively, these circuits are manufactured in the initial IC fabrication process along with sensors 320, which then get seamlessly integrated in the array. As shown in FIG. 2B, a combination of embedded circuitry 350 with sensors 340 enables local functions such as amplification or filtering to be performed without having to reach an edge circuit, and other higher array level functions can be performed by the circuits placed along the edges or in specific locations throughout the array. This embedded circuitry could be formed by utilizing silicon-on-insulator (SOI) substrates and processing approaches.

Figure 3A:
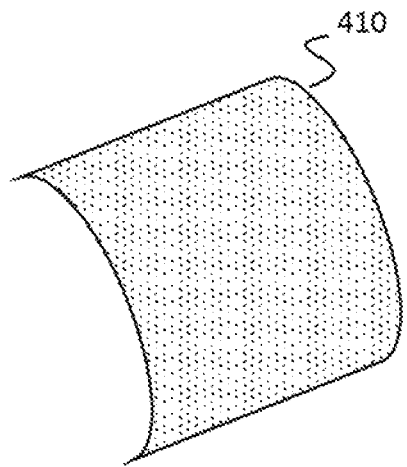
FIG. 3A shows a curved sensor arrays.
Figure 3B:
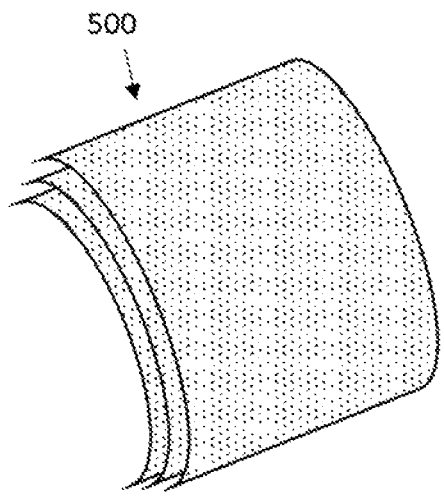
FIG. 3B shows multiple curved layers of sensor arrays.

FIG. 3A shows curved sensor array 410, which is preferably fabricated in a flat configuration and then assembled into any arbitrarily curved configuration to provide the desired physical characteristics and features of the detector. FIG. 3B shows individual and multi-layer arrays 500, which are inherently flexible and integratable in this fashion, as the flexible interconnect provides the necessary bending and stretching without the semiconductor sensor and circuitry components having to be mechanically loaded. This allows multiple complex curvatures to be simultaneously achieved in a single layer which, is not possible with a rigid, fully intact crystalline structure without causing cracks which leads to reliability and functionality degradation. For example, these curvatures can be formed in x-y and x-z planes simultaneously, allowing the sensor to more closely follow the curvature inside the oral cavity for dental x-ray applications. The arrays are preferably fixed in the desired shape with rigid backers with that enable stable imaging and resolution performance. In other applications, a permanently flexible sensor is also possible, for example to cover the inside region of a pipe or a chamber, to allow the highest possible fidelity and resolution for imaging.

Embodiments of the present invention include a semiconductor detector comprising a solar cell component combined with a layer of material to provide stopping power and conversion of high energy x-ray and/or gamma ray radiation to lower energy radiation, such as visible light or electrons that are detectable by a solar cell, to detect the rate of such incident ionizing radiation. The conversion layer may alternatively comprise a material that is sensitive to converting alpha or beta radiation to the type of radiation or electrons visible to the solar cell part of the detector to detect the rate of such alpha or beta radiation, or a material that is sensitive to converting a neutron flux incident on the detector to the type of radiation or electrons visible to the solar cell part of the detector to detect the rate of such a neutron flux. Any of these detectors may be incorporated into a dosimeter.

Embodiments of the present invention comprise an electronic circuit that can (i) record the rate of recorded events by any variant of such detectors, (ii) display the recorded rate of events in units of counts per suitable time unit, and/or a dose rate in any conventionally accepted dose rate units, (iii) integrate the rate of recorded events into a total over time, (iv) display the integrated total of events in units of dose in any conventionally accepted dose units, and/or (v) transmit the rate and/or the integrated total to an external device in any of the conventionally accepted wired or wireless hardware interfaces, including but not limited to RS-232, USB, Ethernet, Bluetooth, and NFC.

Embodiments of the present invention comprise an array of any of the above detectors of a single type with the output of each detector combined into a single signal to be processed by the above electronic circuit for enhanced detection sensitivity with a lower background noise signal for the radiation type of interest. The array may alternatively comprise multiple types of detectors, preferably each with their own electronic circuit, enabling simultaneous detection of multiple radiation types. In another embodiment, the array may comprise detectors of a single type but with conversion layer materials selected for thickness and material type, preferably each with their own electronic circuit, to provide energy discrimination for the incident radiation. Multiple arrays of detectors, each array with its own detector type, and each array with conversion layer materials selected for thickness and material type may be manufactured, each array preferably comprising multiple electronic circuits, for energy discrimination for each incident radiation type.

Embodiments of the present invention comprise a stack of arrays of a single detector type, each array layer preferably comprising multiple electronic circuits, to provide the ability to reconstruct the direction of the incident radiation based on the locality of the reactions recorded with the solar cell component of the detector elements. Each array layer may comprise with multiple conversion layer types, with each conversion layer type portion of each array preferably comprising its own electronic circuits, to provide the ability to reconstruct the direction of the incident radiation based on the locality of the reactions recorded with the solar cell component of the detector elements and energy discrimination of the incident radiation at the same time.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A radiation detector comprising:
   an array of singulated microscale semiconductor sensors disposed on a flexible substrate; and
   at least one type of conversion layer;
   wherein said conversion layer is sufficiently thin to enable the detector to flex in accordance with said substrate;
   wherein the radiation detector is formable into an arbitrary three-dimensional shape; and
   wherein the radiation detector comprises a rigid backer to maintain said shape of the radiation detector.

2. The radiation detector of claim 1 wherein said conversion layer is disposed on top of each sensor, on one or more sides of each sensor, or both on top and on one or more sides of each sensor.

3. The radiation detector of claim 1 wherein said sensors comprise solar cells, photodiodes, or one or more p-n junctions.

4. The radiation detector of claim 3 wherein said sensors detect photons or electrons produced by said conversion layer when said conversion layer is illuminated by incident radiation.

5. The radiation detector of claim 1 comprising different types and/or thicknesses of conversion layers.

6. The radiation detector of claim 5 for simultaneously detecting two or more types of radiation.

7. The radiation detector of claim 6 wherein said types of radiation are selected from the group consisting of x-rays, gamma rays, microwaves, neutrons, alpha particles, beta particles, and cosmic radiation.

8. The radiation detector of claim 5 for performing energy discrimination and/or spectroscopy of incident radiation.

9. The radiation detector of claim 1 comprising multiple stacked substrates and sensor arrays.

10. The radiation detector of claim 9 for detecting directionality and/or tracking particle trajectories of incident radiation.

11. The radiation detector of claim 9 wherein said detector generates multiple signals for each incident radiation particle or photon.

12. The radiation detector of claim 1 comprising integrated circuitry for performing one or more functions on signals produced by said detectors, said functions selected from the group consisting of pre-conditioning, amplification, filtering, and processing.

13. The radiation detector of claim 12 wherein said integrated circuitry is embedded with each said sensor.

14. The radiation detector of claim 13 wherein said one or more functions are performed without said signals having to first be transmitted to an edge circuit.

15. The radiation detector of claim 12 wherein said integrated circuitry is manufactured in the same process as a process used to manufacture said sensors.

16. The radiation detector of claim 12 wherein said integrated circuitry is added to said detector after said sensors are manufactured.

17. The radiation detector of claim 1 wherein flexing of said conversion layer in accordance with flexing of said substrate does not result in substantial loss of functionality.

\* \* \* \* \*